(12) United States Patent
Koizumi et al.

(10) Patent No.: US 7,123,346 B2
(45) Date of Patent: Oct. 17, 2006

(54) PROJECTION EXPOSURE APPARATUS WITH LINE WIDTH CALCULATOR CONTROLLED DIAPHRAGM UNIT

(75) Inventors: Ryo Koizumi, Tochigi (JP); Kazuhiro Takahashi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 81 days.

(21) Appl. No.: 10/847,318

(22) Filed: May 18, 2004

(65) Prior Publication Data

US 2004/0212793 A1    Oct. 28, 2004

Related U.S. Application Data

(62) Division of application No. 09/817,041, filed on Mar. 27, 2001.

(30) Foreign Application Priority Data

Mar. 30, 2000    (JP)    .............................. 2000-094954

(51) Int. Cl.
*G03B 27/52* (2006.01)
*G03B 27/54* (2006.01)
(52) U.S. Cl. ......................................... 355/55; 355/67
(58) Field of Classification Search .................. 355/52, 355/53, 55, 67–71; 356/399–401; 250/548
See application file for complete search history.

(56) References Cited

U.S. PATENT DOCUMENTS 4,931,830 A    6/1990    Suwa et al. ................... 355/71

5,526,093 A    6/1996    Takahashi ..................... 355/53
5,597,670 A *    1/1997    Aketagawa et al. .......... 430/30

(Continued)

FOREIGN PATENT DOCUMENTS

JP    2-50417    2/1990

(Continued)

OTHER PUBLICATIONS

Japanese Office Action dated Sep. 8, 2004, issued in a corresponding Japanese patent application No. 2000-094954, with English translation, 3 pages.

*Primary Examiner*—Henry Hung Nguyen
(74) *Attorney, Agent, or Firm*—Fitzpatrick, Cella, Harper & Scinto

(57) ABSTRACT

A projection exposure apparatus includes a diaphragm controlling unit controlling one or more of an diaphragm, an iris diaphragm, and a relay lens system. In addition, the projection exposure apparatus also includes a line width calculator which calculates a bias, which is a difference between a line width in a dense part and a line width in an isolated part, based on information regarding a mask pattern, the wavefront aberration of a lens, the effective light source of an illumination optical system, the half-width of a laser, the temperature change in a projection optical system due to exposure, etc. When the bias is out of a tolerance range, the line width calculator calculates a correction value for the diaphragm of the projection optical system or a correction value for the effective light source of the illumination optical system in accordance with the bias which is to be corrected. Then, the diaphragm controlling unit is driven in accordance with the calculation results.

6 Claims, 7 Drawing Sheets

U.S. PATENT DOCUMENTS

| | | | |
|---|---|---|---|
| 5,633,713 A | 5/1997 | Tanaka et al. | 356/355 |
| 5,661,547 A * | 8/1997 | Aketagawa et al. | 355/53 |
| 5,831,715 A | 11/1998 | Takahashi | 355/53 |
| 5,925,887 A | 7/1999 | Sakai et al. | 250/548 |
| 5,965,306 A * | 10/1999 | Mansfield et al. | 430/22 |
| 6,040,894 A | 3/2000 | Takahashi | 355/53 |
| 6,114,071 A * | 9/2000 | Chen et al. | 430/5 |
| 6,514,122 B1 * | 2/2003 | Saito et al. | 451/5 |

FOREIGN PATENT DOCUMENTS

| | | | |
|---|---|---|---|
| JP | 6-020922 | | 1/1994 |
| JP | 6-120114 | | 4/1994 |
| JP | 6120114 | * | 4/1994 |
| JP | 8-250411 | | 9/1996 |
| WO | WO 99/30356 | | 6/1999 |

* cited by examiner

DENSE PART
(repeated lines)

ISOLATED PART
(isolated line)

PROJECTION EXPOSURE APPARATUS WITH LINE WIDTH CALCULATOR CONTROLLED DIAPHRAGM UNIT

This application is a divisional of copending U.S. patent application Ser. No. 09/817,041, filed Mar. 27, 2001.

BACKGROUND OF THE INVENTION

1. Field of the Invention

The present invention relates to projection exposure apparatuses and to projection exposure methods. More specifically, the present invention relates to a projection exposure apparatus and to a projection exposure method in which both a line width in an isolated pattern and a line width in repeated patterns are accurately controlled.

2. Description of the Related Art

In a lithography process, lines formed on a substrate have become increasingly fine. Accordingly, the lines are required to have uniform width with high accuracy. In a uniform pattern, line widths are easily controlled by adjusting the exposure level.

However, in a case in which a mask includes both a pattern of repeated lines and a pattern of an isolated line, it is difficult to control the line widths of both patterns to be within a tolerance range at the same time.

FIG. 9 is a schematic representation of an example of a mask pattern including repeated lines (dense part) and an isolated line (isolated part). The line width in the dense part and the line width in the isolated part are the same in the mask. As a result of a projection exposure, however, the widths of the lines formed on a substrate of, for example, a semiconductor wafer, are different from each other. Even when the projection exposure is performed while the substrate surface (resist surface) is disposed at the best focus position of a projection optical system in an exposure apparatus, the line width in the dense part, Ld, and the line width in the isolated part, Li, differ after developing the resist on the substrate. Accordingly, it is necessary to control a CD (critical dimension) bias "B", which is defined in the descriptions herein as B=(Ld−Li).

Even when a plurality of projection lenses, which are manufactured with the same design, are used, the CD bias "B" differs in accordance with the wavefront aberration, which differs between individual lenses. In addition, it has been discovered that the CD bias "B" varies with the half-width of a laser beam for exposure which affects the chromatic aberration, and with the wavefront aberration, which varies with the temperature of the projection lens which depends on an exposure history.

In addition, it has also been discovered that the variation of the CD bias "B" also occurs due to vibration of a stage.

In addition, the CD bias "B" also differs in accordance with line widths, kinds of patterns, kinds of masks (binary mask, halftone mask, etc.), and illumination conditions (annular illumination, quadrupole illumination, normal (circular) illumination).

SUMMARY OF THE INVENTION

Accordingly, it is an object of the present invention to provide a projection exposure apparatus which is capable of controlling the CD bias "B".

To this end, according to an aspect of the present invention, the projection exposure apparatus includes, an illumination optical system for illuminating a mask; a projection optical system for projecting patterns formed in the illuminated mask on a photosensitive substrate; a line width calculating unit for calculating line width information of an image formed on the photosensitive substrate by projecting the patterns in the mask by the projection optical system; and a controlling unit for changing, in accordance with the calculation result obtained by the line width calculating unit, at least one of a diameter of an aperture of a diaphragm in the projection optical system and the size of an effective light source in the illumination optical system.

The line width information calculated by the line width calculating unit may be a difference between a width of repeated lines, which are formed by alternately arranging transparent regions and light-shielding regions, and a width of an isolated line, which is formed by disposing one of a single transparent region and a single light-shielding region.

In addition, the line width calculating unit may calculate the line width information based on information regarding wavefront aberration of the projection optical system.

In addition, the line width calculating unit may calculate the line width information based on information regarding line widths which are obtained by performing an exposure process in advance.

In addition, the projection optical system may include a monitoring unit for monitoring an amount of optical energy which is incident per unit of time, and the line width calculating unit may calculate the line width information based on the result obtained by the monitoring unit.

In addition, the line width calculating unit may calculate the line width information based on information regarding a wavelength of the light source.

The information regarding the wavelength may be a center wavelength of the light source.

In addition, the information regarding the wavelength may be a half-width (FWHM: Full-Wide Half Maxima) of the wavelength spectrum of the light source.

According to another aspect of the present invention, a projection exposure apparatus includes an illumination optical system for illuminating a mask; a projection optical system for projecting patterns formed in the illuminated mask on a photosensitive substrate; a unit for inputting measurement result of line widths in multiple kinds of resist images or a value of a CD bias which is obtained from the measurement result; and a unit for changing, in accordance with the input result, at least one of a diameter of an aperture of a diaphragm in the projection optical system and the size of an effective light source in the illumination optical system.

According to another aspect of the present invention, a projection exposure method using one of the above-described projection exposure apparatuses includes the steps of calculating line width information of an image formed on the photosensitive substrate by projecting the pattern in the mask by the projection optical system and changing, in accordance with the calculation result obtained at the calculating step, at least one of the diameter of the aperture of the diaphragm in the projection optical system and the size of the effective light source in the illumination optical system.

According to another aspect of the present invention, a projection exposure method includes the steps of exposing a wafer with a device pattern by using one of the above-described projection exposure apparatuses, and developing the exposed wafer.

According to another aspect of the present invention, a projection exposure apparatus includes a unit for determining whether or not a CD bias regarding a mask including a repeated pattern and an isolated pattern is within a tolerance range; and a unit for changing, when the result of the determination is negative, at least one of a numerical aperture of an illumination optical system, a numerical aperture of a projection optical system, a wavefront aberration of the projection optical system, a coherence factor σ, an exposure wavelength, a half-width of a wavelength spectrum of exposure light, and an exposure amount, as apparatus conditions.

According to another aspect of the present invention, a projection exposure apparatus includes a unit for determining whether or not a line width of a pattern image formed on a wafer by exposure is within a tolerance range; and a unit for changing, when the result of the determination is negative, at least one of a numerical aperture of an illumination optical system, a numerical aperture of a projection optical system, a wavefront aberration of the projection optical system, a coherence factor σ, an exposure wavelength, a half-width of a wavelength spectrum of exposure light, and an exposure amount, as apparatus conditions.

According to another aspect of the present invention, an exposure apparatus includes a calculating unit for calculating a CD bias regarding a mask including a repeated pattern and an isolated pattern based on information regarding exposure conditions and line widths of the repeated pattern and the isolated pattern.

According to another aspect of the present invention, an exposure apparatus includes a calculating unit for calculating line width information of a pattern image, which is formed on a wafer by exposure, based on information regarding exposure conditions and line widths of a pattern in a mask.

According to another aspect of the present invention, an exposure apparatus includes a unit for obtaining a CD bias regarding a mask based on at least one of a numerical aperture of an illumination optical system, a numerical aperture of a projection optical system, a wavefront aberration of the projection optical system, a coherence factor σ, an exposure wavelength, a half-width of a wavelength spectrum of exposure light, and an exposure amount, as exposure conditions, and based on information regarding line widths in a repeated pattern and an isolated pattern included in the mask; a unit for determining whether or not the obtained CD bias is within a tolerance range; and a unit for obtaining a CD bias which is within the tolerance range by changing, when the result of the determination is negative, at least one of the numerical aperture of the illumination optical system, the numerical aperture of the projection optical system, the wavefront aberration of the projection optical system, the coherence factor σ, the exposure wavelength, the half-width of wavelength spectrum of exposure light, and the exposure level, as apparatus conditions.

According to another aspect of the present invention, a projection exposure apparatus includes a unit for correcting, when exposure is performed using a mask including a repeated pattern and an isolated pattern, a change of a CD bias regarding the mask which occurs due to a change of a half-width of a wavelength spectrum of the exposure light.

According to another aspect of the present invention, a projection exposure apparatus includes unit for correcting, when exposure is performed using a mask including a repeated pattern and an isolated pattern, a change of a CD bias regarding the mask which occurs due to a degradation of a wavefront aberration in a projection optical system.

According to another aspect of the present invention, a projection exposure apparatus includes a unit for correcting, when exposure is performed using a mask including a repeated pattern and an isolated pattern, a degradation of a CD bias regarding the mask which occurs due to a change of a wavefront aberration in a projection optical system caused by a temperature change which occurs when exposure is repeated.

According to another aspect of the present invention, a projection exposure apparatus includes a unit for changing at least one of a numerical aperture of an illumination optical system and a numerical aperture of a projection optical system in accordance with a change of a half-width of a wavelength spectrum of exposure light.

According to another aspect of the present invention, a projection exposure apparatus includes a unit for changing at least one of a numerical aperture of an illumination optical system and a numerical aperture of a projection optical system in accordance with an exposure history.

According to another aspect of the present invention, a projection exposure apparatus includes a unit for changing at least one of a numerical aperture of an illumination optical system and a numerical aperture of a projection optical system in accordance with a change of wavefront aberration in the projection optical system.

Further objects, features and advantages of the present invention will become apparent from the following description of the preferred embodiments with reference to the attached drawings.

DESCRIPTION OF THE PREFERRED EMBODIMENTS

Embodiments of the present invention will be described below with reference to the accompanying drawings.

In a projection exposure apparatus according to an embodiment of the present invention, information regarding CD bias "B", which corresponds to numerical aperture (NA) in a projection optical system and to the size and the shape of a secondary light source (effective light source) of an illumination optical system, is collected and stored in advance.

On the other hand, a line width calculator calculates CD biases "B" at a plurality of positions in an effective area of the projection optical system, based on the following parameters. That is, information regarding the wavefront aberration of the projection optical system, a repeated pattern and an isolated pattern formed in a mask (reticle), and an effective light source (secondary light source) of the illumination optical system for exposing the patterns on a wafer, are used for the calculation.

When the calculated CD bias "B" is out of a tolerance range, an diaphragm of the projection optical system or a diaphragm of the illumination optical system is controlled, so that numerical aperture (NA) of the projection optical system or the illumination condition σ (sigma), which is also known as coherence factor, is changed, and a desired CD bias "B" within the tolerance range is obtained.

In place of the above-described calculation, line widths in multiple kinds of patterns, which are obtained after the exposure, may be input to the line width calculator. When the input results are not desired values, a correction value for the CD bias "B" is calculated, and at least one of the diaphragm of the projection optical system or a diaphragm of the illumination optical system is controlled in accordance with the calculation result. Accordingly, at least one of numerical aperture (NA) of the projection optical system and the illumination condition σ (sigma) is changed, and the desired CD bias is obtained.

In addition, a change in the aberrations of the projection optical system may be calculated based on a change of the half-width (FWHM: Full-Wide Half Maxima) of the light source, exposure light, or an exposure history energy applied to the projection optical system. The difference in line widths may then be obtained in accordance with the aberrations of the projection optical system after the change. If the result is out of the tolerance range, the CD bias "B" is corrected by changing the numerical aperture (NA) of the projection optical system or by changing σ (sigma), which is the size of the effective light source of the illumination optical system.

The above-described σ (sigma) is calculated by dividing the diameter of an image of the effective light source projected on the aperture of an diaphragm of the projection optical system by the diameter of the aperture.

Figure 1:
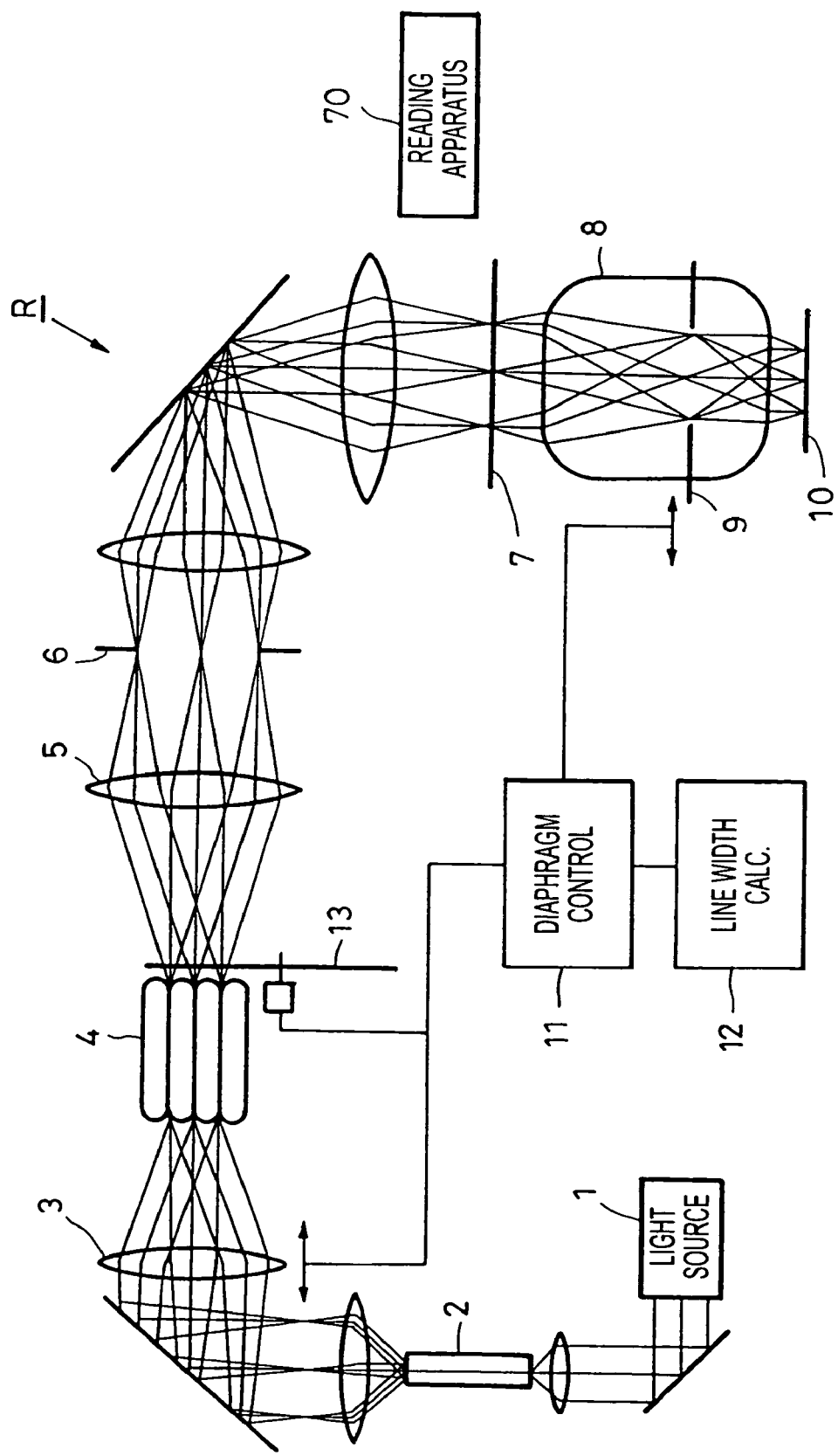
FIG. 1 is a schematic representation of a projection exposure apparatus according to the present invention.

FIG. 1 is a schematic representation of a projection exposure apparatus according to the present invention. The projection exposure apparatus exposes a device pattern on a plurality of regions of a wafer by a step-and-repeat method or by a step-and-scan method. In FIG. 1, the light source 1 is a KrF excimer laser or ArF excimer laser, and emits luminous flux having a wavelength of 248 nm or 193 nm, respectively. The luminous flux is collected by a lens, and is incident into an internal reflection member 2, which is called a light pipe, a rod-shaped integrator, or an internal reflection integrator.

The incident light is reflected many times at the inner surface of the internal reflection member 2, and the light intensity distribution, which is not uniform at the entrance surface at one end of the internal reflection member 2, becomes uniform at the exit surface at the other end thereof. The internal reflection member 2 may be a kaleidoscope, in which a plurality of long mirrors oppose one another, or a rod-shaped glass (quartz) of which the cross section perpendicular to the optical axis has a polygonal shape. In the case in which the rod-shaped glass is used, it is designed in a manner such that when the light beam reaches the inner surface of the rod, total reflection occurs due to the difference in indexes of refraction between the glass material and air.

The luminous flux, which is formed at the exit surface of the internal reflection member 2, and which has a uniform light intensity distribution, is projected on an entrance surface of a fly's eye lens 4 by a relay lens system 3. The fly's eye lens 4 is formed by stacking biconvex rod lenses which are constructed such that a focus of an incidence surface is on an exit surface and a focus of the exit surface is on the incidence surface. The luminous flux, which is incident on the rod lenses of the fly's eye lens 4, is collected by each of the rod lenses, so that multiple light spots are formed on the exit surface of the fly's eye lens 4.

A light system 5 is provided for uniformly illuminating an illumination area by using the light spots, which are formed on the exit surface of the fly's eye lens 4, as a secondary light source. Since it is necessary to control the illumination area of a mask 7 in the projection exposure apparatus, a uniform light intensity distribution is formed at a conjugate position of the position of the mask 7. In the figure, a diaphragm 6 is disposed at the conjugate position of the position of the mask 7. Accordingly, multiple luminous fluxes from the above-described light spots are superposed at the position of the diaphragm 6, so that a uniform light intensity distribution is formed at this position. The uniform light intensity distribution is projected by a relay optical system R to the same size and shape as the mask 7. Accordingly, the mask 7 is illuminated. The diaphragm 6 is constructed of four light-shielding plates, which are movable perpendicularly to the optical axis. The four light-shielding plates are moved in accordance with the illumination area of the mask 7.

A projection optical system 8 is provided for forming patterns in the mask 7 on a substrate 10, such as a semiconductor wafer, etc., on which resist is applied. In the projection optical system 8, both the side at the mask 7 and the side at the substrate 10 are formed as telecentric systems, and projection magnification does not change even when the mask 7 and the substrate 10 are moved along the optical axis.

In the case in which the projection exposure apparatus is a scanning projection exposure apparatus, the mask 7 and the substrate 10, such as a semiconductor wafer, are synchronously scanned with each other.

The projection optical system 8 includes a variable diaphragm 9 in which a diameter of the aperture is adjustable. The numerical aperture (NA) of the projection optical system 8 may be adjusted by adjusting the diameter of the aperture, so that brightness, resolution, and depth of focus are controlled. The projection optical system 8 is well known in the art, and a dioptric system constructed of only a plurality of lenses, a catadioptric system constructed of a lens and a concave mirror, or a reflection system constructed of a plurality of mirrors may be applied as the projection optical system 8.

A turret-type diaphragm 13 includes multiple kinds of apertures, such as a circular aperture, a quadrupole aperture, an annular aperture, etc., which are arranged circularly. The turret-type diaphragm 13 is provided for adjusting the numerical aperture (NA) of the illumination optical system, so as to control the size and the shape of the luminous fluxes at the position near the exit surface of the fly's eye lens 4, that is, the secondary light source. One of the apertures in the turret-type diaphragm 13 is a circular aperture, of which the diameter is adjustable. The relay lens system 3 has a function of changing the magnification (zoom function), and is capable of controlling the numerical aperture (NA) of the illumination optical system by controlling the luminous flux at an image plane at the entrance side of the fly's eye lens 4.

A diaphragm control unit 11 controls one or more of the variable diaphragm 9 which determines the numerical aperture (NA) of the projection optical system 8, the turret-type diaphragm 13 which determines the size and shape of the secondary light source of the illumination optical system, and the relay lens system 3 which is a zoom lens, in accordance with requirements. The size and the shape of the effective light source of the projection exposure apparatus may be controlled by controlling at least one of the turret-type diaphragm 13 and the relay lens system 3.

A line width calculator 12 calculates the CD bias "B" between the repeated pattern and the isolated pattern in the mask 7. The calculation is performed based on information regarding patterns formed in the mask 7, the wavefront aberration of the projection optical system 8, and the size and the shape of the secondary light source of the illumination optical system. In addition, information regarding the half-width of the wavelength spectrum of the light source (laser) 1 and the temperature change in the projection optical system 8 due to the exposure are also used for calculating the CD bias "B", in accordance with requirements. The information regarding the patterns in the mask 7 may be manually input to the line width calculator 12, or a reading unit 70 may read a bar code of the mask 7 and input the obtained information to the line width calculator 12.

When the CD bias "B" is out of the tolerance range, a correction value for the variable diaphragm 9 of the projection optical system 8 or a correction value for the secondary light source (effective light source) of the illumination optical system is calculated in accordance with the CD bias "B" which is to be corrected. Then, the diaphragm controlling unit 11 is driven in accordance with the calculation results.

The projection exposure apparatus may be used for experimentally exposing one or more kinds of repeated patterns and isolated patterns under certain conditions, and the obtained CD biases "B" may be measured. In addition, the measurement results may be stored in the line width calculator 12 in advance. Accordingly, an optimum value of the CD bias "B" or the correction values may be calculated by using the stored measurement results as standards.

Examples of the results of the calculations performed by the line width calculator 12 will be described below.

Figure 2:
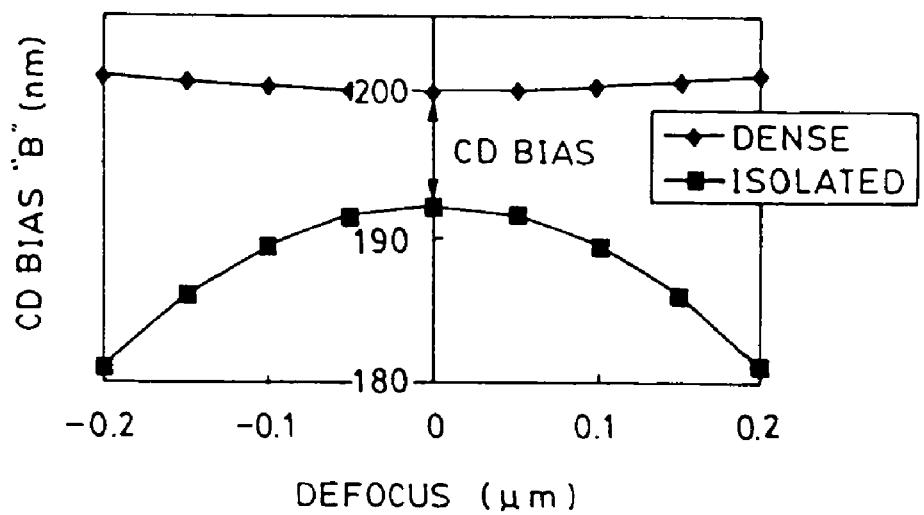
FIG. 2 is a graph showing the relationship between amount of defocus and CD bias "B"
Figure 9:
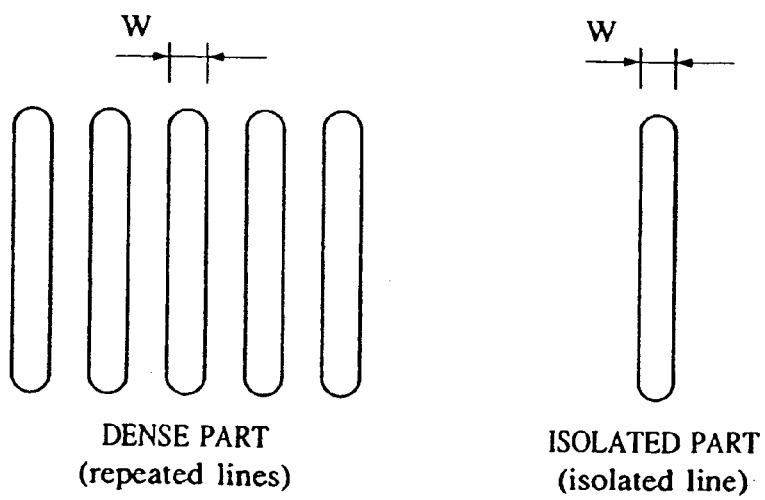
FIG. 9 is a schematic representation of an example of a mask pattern including a repeated pattern and an isolated pattern.

FIG. 2 is a graph showing the relationship between the amount of defocus (position of the wafer surface in an optical axis direction) and CD bias "B" under conditions in which the nominal value of the line width in a dense part of a reticle pattern, which is shown in FIG. 9, is 200 nm, the NA of the projection optical system 8 is 0.65, the exposure wavelength is 248 nm, and ⅔ annular illumination (outside a=0.80) is applied. As can be understood from the graph, the CD bias "B" becomes minimized under the best focus condition, and increases along with the amount of defocus. Thus, when the exposure amount is adjusted so that the line width in the dense part becomes closer to the nominal line width, which is the product of the line width in the mask and the projection magnification of the projection optical system 8, such as ¼ or ⅕, the width of an isolated line becomes farther from a desired value (for example, the nominal line width), due to the aberrations of the projection optical system 8.

Figure 3:
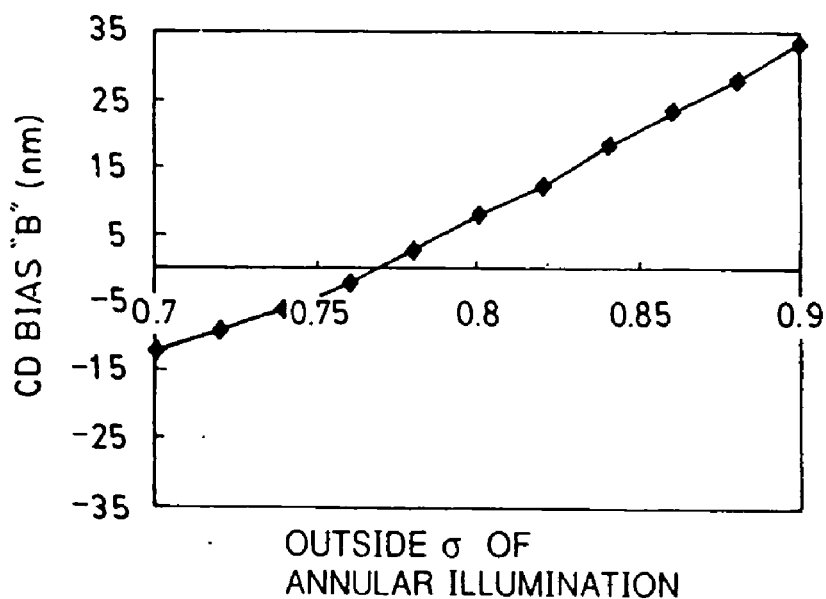
FIG. 3 is a graph showing the relationship between outside σ and CD bias "B"

FIG. 3 is a graph showing the relationship between the outside diameter (outside σ) and the CD bias "B", under conditions in which the nominal value of the line width in the dense part of the reticle pattern, which is shown in FIG. 9, is 200 nm, the NA of the projection optical system 8 is 0.65, the exposure wavelength is 248 nm, and the annular illumination (inside σ=0.533) is applied. With reference to the graph, the CD bias "B" is approximately zero when the outside a is 0.75. Thus, in accordance with the line width calculator 12, the diaphragm controlling unit 11 controls the turret-type diaphragm 13 or the relay lens system 3 in a manner such that the outside σ becomes 0.75 without changing the exposure amount from the condition of FIG. 2.

Figure 4:
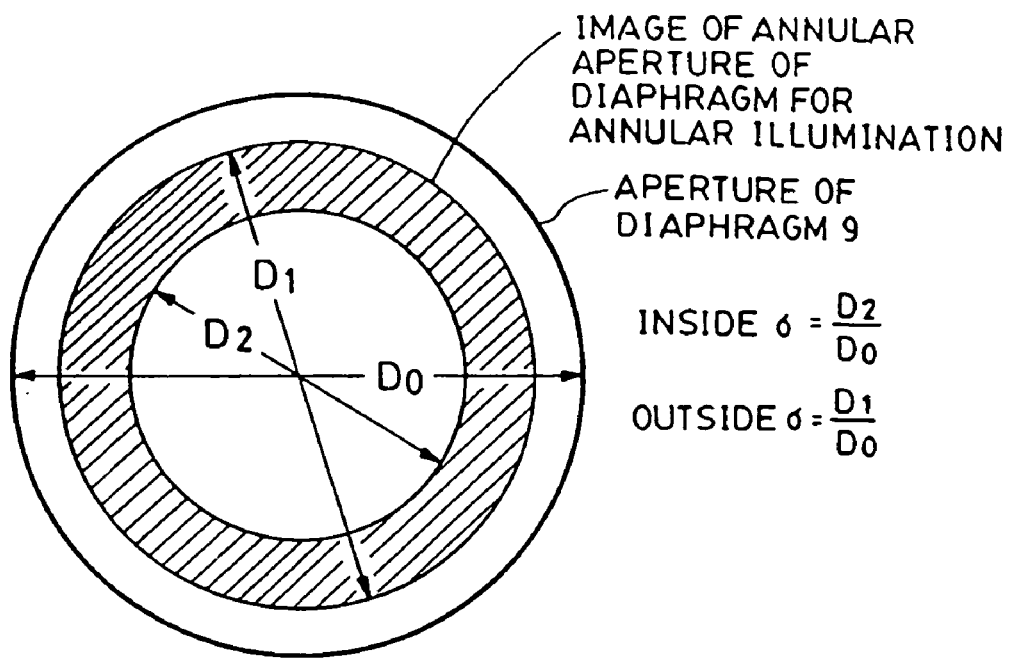
FIG. 4 is an explanatory drawing for explaining inside σ and outside σ in annular illumination.

FIG. 4 is an explanatory drawing which shows the inside a and the outside a in the annular illumination.

Figure 5:
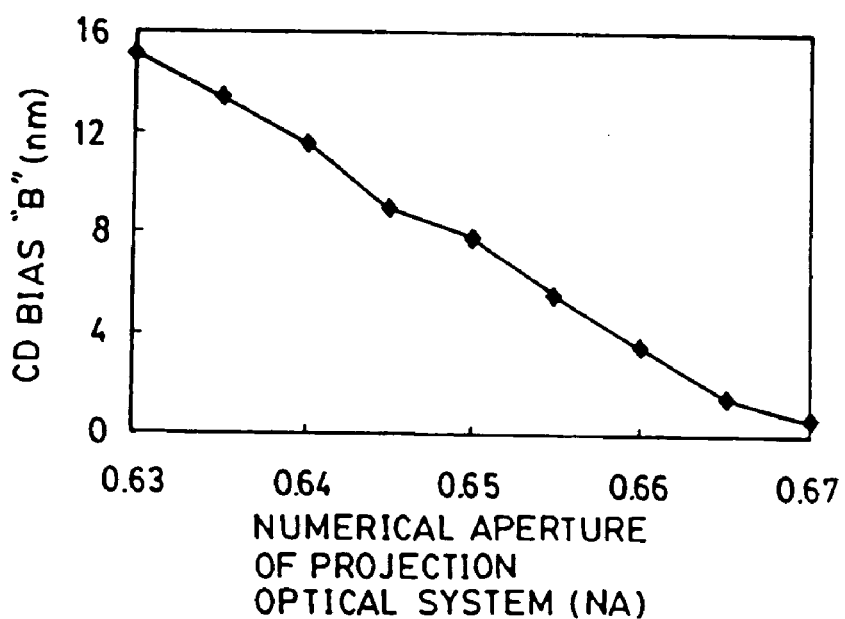
FIG. 5 is a graph showing the relationship between numerical aperture (NA) of a projection lens and CD bias "B" when the numerical aperture (NA) of the projection lens is varied around 0.65 under conditions in which the nominal value of a line width in a dense part is 200 nm, the exposure wavelength is 248 nm, and ⅔ annular illumination, in which outside σ is 0.8, is applied.

FIG. 5 is a graph showing the relationship between the numerical aperture (NA) of the projection optical system 8 and CD bias "B" when the numerical aperture (NA) of the projection optical system 8 is varied around 0.65 under conditions in which the nominal value of the line width in the dense part of the reticle pattern, which is shown in FIG. 9 is 200 nm, the exposure wavelength is 248 nm, and annular illumination, in which outside σ is 0.8, is applied. The numerical aperture (NA) of the projection optical system 8 corresponding to the tolerance range of the CD bias "B" is determined based on this graph. According to the present invention, the variable diaphragm 9 is controlled by the diaphragm controlling unit 11 so that the numerical aperture (NA) of the projection optical system 8 is adjusted to the determined value without changing the exposure amount from the condition in FIG. 2.

Figure 10:
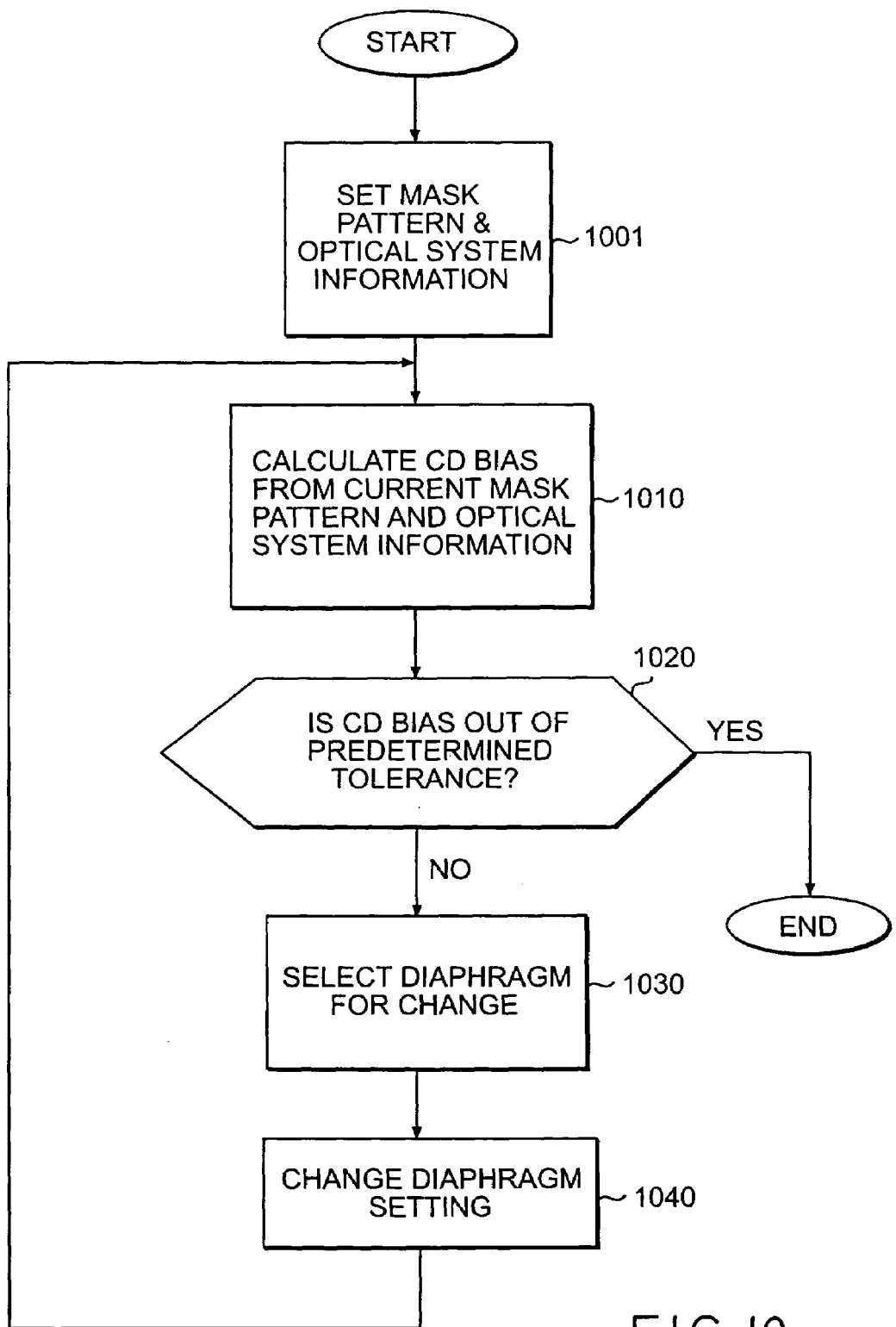
FIG. 10 is a flow chart illustrating adjustment of the CD bias in the projection exposure apparatus of FIG. 1.

An example of calculating the CD bias between the repeated pattern and the isolated pattern in the mask 7 is illustrated in FIG. 10. The conditions of the optical system and the mask pattern information are first set in a step 1001. As indicated with respect to FIG. 3, the conditions may be set as a reticle pattern dense part nominal line width of 200 nm, a projection optical lens 8 NA of 0.65, an exposure wavelength of 248 nm and an inside annular illumination σ of 0.533. The pattern information of the mask 7 may be manually input from a bar code. The relation of the CD bias to the optical system conditions and the mask pattern information is obtained from previous measurements and may be stored in table corresponding to the graphs of FIGS. 2, 3, 5 and 6 so that the CD bias is calculated therefrom in step 1010. It is then determined in step 1020 if the calculated CD bias is within a predetermined tolerance. If not, a diaphragm of the variable diaphragm 9, the turret-type diaphragm 13, and the relay lens system 3 is selected to change the CD bias in step 1030 and the change in effected in a step 1040. A recalculation of the CD bias is then performed using the changed conditions in the step 1010. The loop from step 1010 to the step 1040 is iterated until the CD bias is within the predetermined bias in the decision step 1020. As described with respect to FIG. 3, the turret-type diaphragm 13 or the relay lens system 3 may be controlled by the diaphragm controlling unit 11 so that the outside σ becomes 0.75 without changing the exposure amount from the condition of FIG. 2. Alternatively, as discussed with respect to FIG. 5, the variable diaphragm 9 may be controlled by the diaphragm controlling unit 11 so that the NA of the projection optical system 8, as in the graph of FIG. 5, is adjusted to provide the change in the CD bias.

Figure 6:
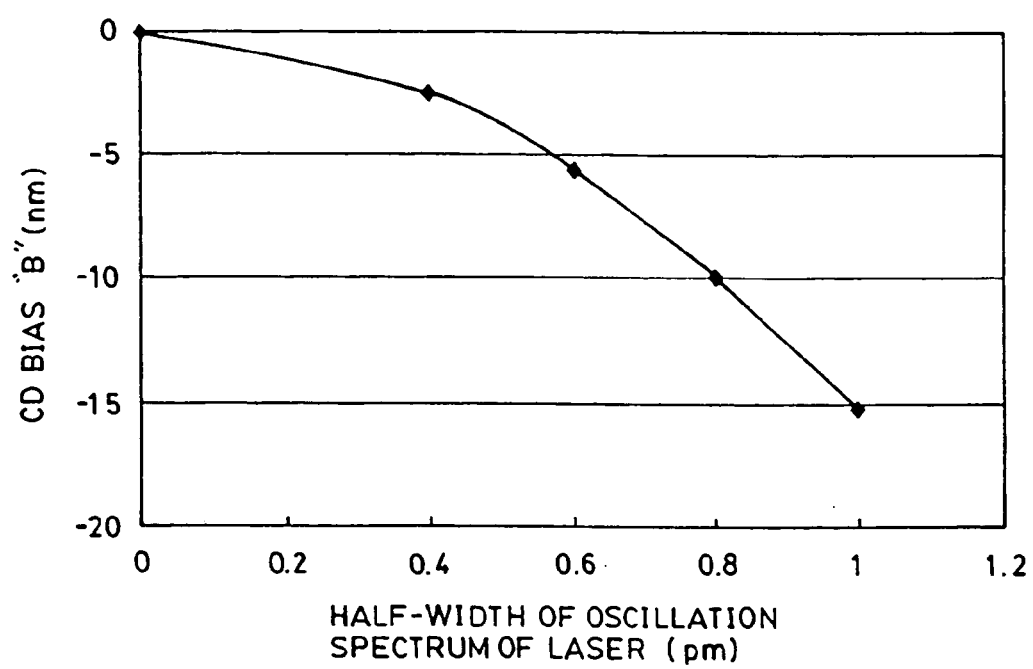
FIG. 6 is a graph showing the relationship between a half-width of a wavelength spectrum of a laser beam for exposure and the CD bias "B", under conditions in which the nominal value of a line width in a dense part is 200 nm, the numerical aperture (NA) of the projection lens is 0.65, the exposure wavelength is 248 nm, and ⅔ annular illumination, in which outside σ is 0.8, is applied.

FIG. 6 is a graph showing the relationship between the half-width of the wavelength spectrum of the laser beam for the exposure and the CD bias "B" under conditions in which the nominal value of the line width in the dense part of the reticle pattern, which is shown in FIG. 9, is 200 nm, the numerical aperture (NA) of the projection optical system 8 is 0.65, the exposure wavelength is 248 nm, and ⅔ annular illumination, in which outside σ is 0.8, is applied. The half-width of the light source (laser) is detected by known means (not shown), such as a wavelength detector contained in the light source (laser) 1, and the CD bias "B" corresponding to the detected half-width is determined by the graph shown in FIG. 6. When the determined CD bias "B" is not in the tolerance range, the outside σ or numerical aperture (NA) of the projection optical system for correcting the change of the CD bias "B" due to the change of half-width is calculated. This calculation is based on, for example, the relationship of the outside σ and the CD bias "B" shown in FIG. 3, or the relationship between the numerical aperture (NA) of the projection optical system and the CD bias "B" shown in FIG. 5. Accordingly, the diaphragm controlling unit 11 is operated based on the result of the calculation.

Next, an embodiment of a manufacturing method for a semiconductor device using the above-described projection exposure apparatus will be described below.

Figure 7:
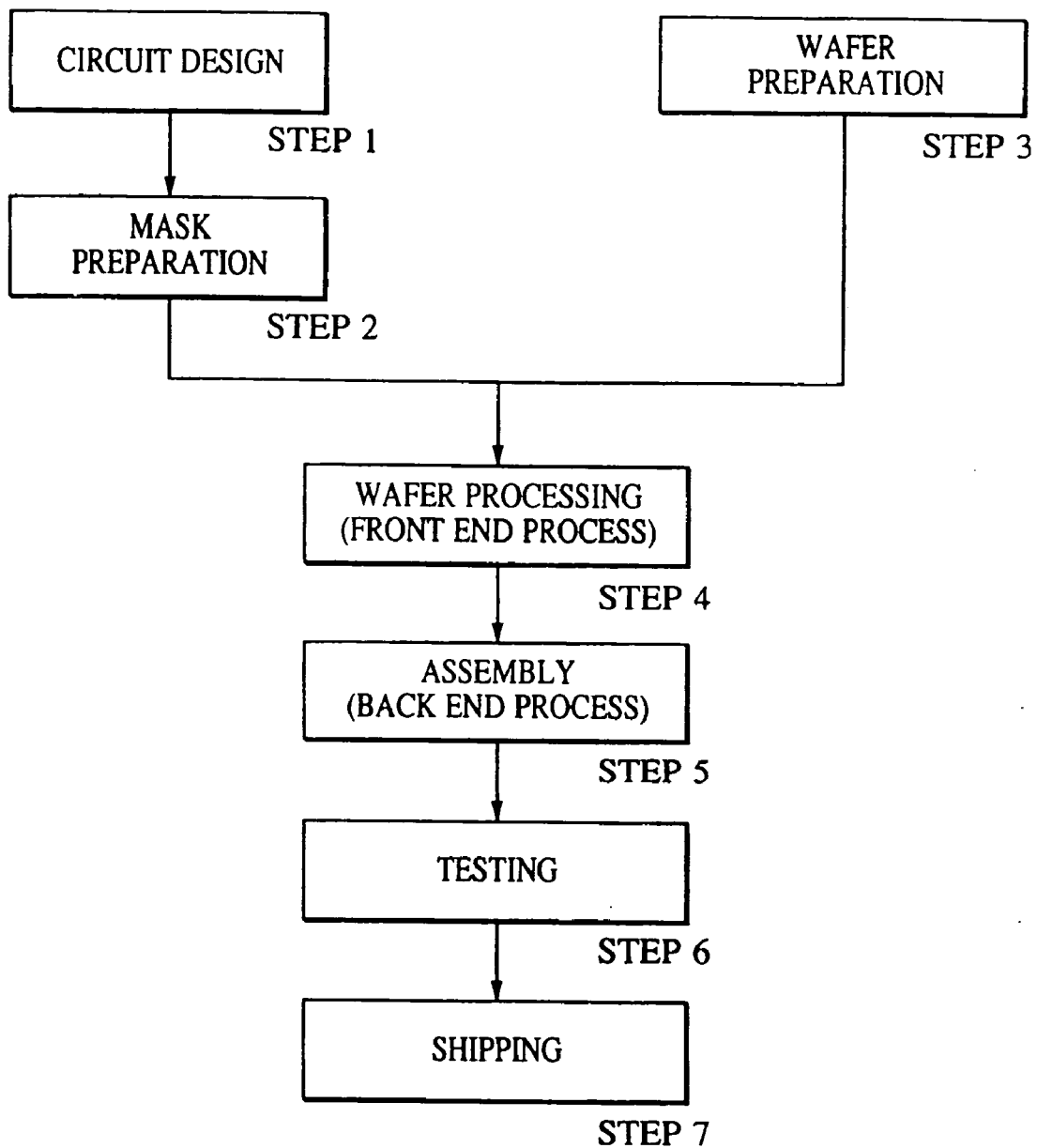
FIG. 7 is a flowchart of a device manufacturing process.

FIG. 7 is a flowchart which shows a manufacturing process of a semiconductor device (a semiconductor chip such as an IC and an LSI, a liquid crystal panel, a CCD, etc.). In step 1 (circuit design), circuits for the semiconductor device are designed. In step 2 (mask preparation), a mask is manufactured, in which the designed circuit pattern is formed. In step 3 (wafer preparation), a wafer is manufactured from, for example, silicon. Step 4 (wafer processing) is known as a front-end process, and an actual circuit is formed on the wafer by a lithographic technique using the above-described mask and the wafer. Step 5 (assembly) is known as a back-end process, and semiconductor chips are formed by using the wafer which is processed at Step 4. Step 5 includes assembly processes (dicing, bonding), packaging processes (enclosing of the chips), etc. In Step 6 (testing), various tests including operation tests, durability tests, etc., of the semiconductor device formed at Step 5 are performed. Accordingly, the semiconductor device is completed, and is shipped (Step 7).

Figure 8:
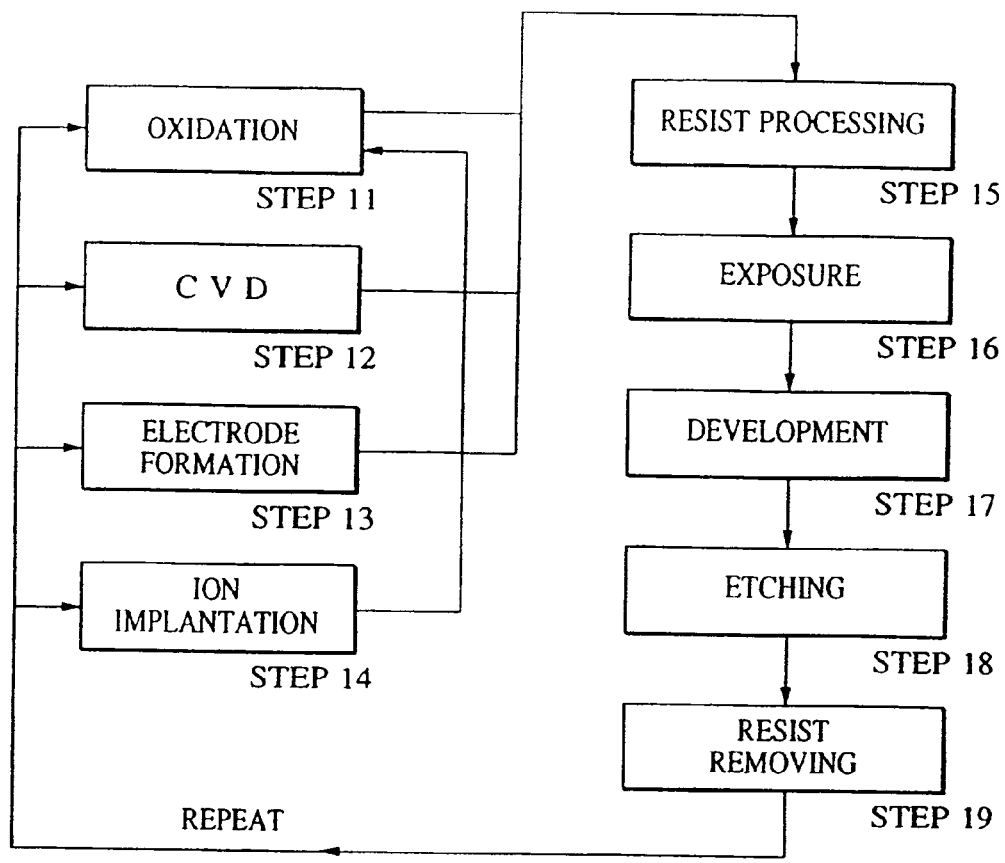
FIG. 8 is a flowchart of a wafer process.

FIG. 8 is a flowchart which shows Step 4, the wafer processing, in detail. In Step 11 (oxidation), the surface of the wafer is oxidized. In Step 12 (CVD), an insulating layer is formed on the surface of the wafer. In Step 13 (electrode formation), electrodes are formed on the wafer by, for example, vapor deposition. In Step 14 (ion implantation), ions are implanted in the wafer. In Step 15 (resist processing), photosensitive material is applied on the wafer. In Step 16 (exposure), the circuit pattern in the mask is exposed on the wafer by the above-described exposure apparatus. In Step 17 (development), the exposed wafer is developed. In Step 18 (etching), parts which are not covered by the resist are etched. In Step 19 (resist removing), the resist which is not necessary after the etching is removed. By repeating the above-described steps, the circuit pattern having multiple levels is formed.

According to the manufacturing method of the present embodiment, semiconductor devices having high precision, which have been difficult to manufacture, may be manufactured.

In addition, according to the above-described embodiments of the present invention, the difference between the line width in the repeated pattern and the line width in the isolated pattern may be reduced to within a desired range, regardless of the difference between projection exposure apparatuses.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus comprising:
a device for determining whether a current CD bias regarding a mask including a repeated pattern and an isolated pattern is within a tolerance range; and
a corrector for changing, when the current CD bias is not within the tolerance range, a width of a wavelength spectrum of exposure light.

2. A device producing method comprising:
a step for exposing a wafer with a device pattern by an exposure apparatus according to claim 1; and
a step for developing the exposed wafer.

3. An exposure apparatus comprising:
a controller for obtaining a CD bias regarding a mask on the basis of at least one of a numerical aperture of an illumination optical system NA, a numeral aperture of a projection optical system NA, a wavefront aberration of a projection optical system, a coherence factor σ, an exposure wavelength, a width of a wavelength spectrum of exposure light or a plurality of parameters of exposure amount, information of line widths of a repeated pattern and an isolated pattern of a mask, wherein said controller provides, in a case that the obtained CD bias is not within the tolerance range, the CD bias within the tolerance range by changing a width of a wavelength spectrum of exposure light.

4. A device producing method comprising:
a step for exposing a wafer with a device pattern by an exposure apparatus according to claim 3; and
a step for developing the exposed wafer.

5. An exposure apparatus comprising:
a controller for obtaining a CD bias regarding a mask on the basis of a width of a wavelength spectrum of exposure light and information of a repeated pattern of a mask and a line width of an isolated pattern, for determining whether the obtained CD bias is within a tolerance range, wherein said controller provides, in a case that the obtained CD bias is not within the tolerance range, the CD bias within the tolerance range by changing at least one of a numerical aperture of an illumination system NA, a numerical aperture of a projection optical system, a wavefront aberration of a projection optical system, a coherence factor σ, the exposure wavelength, a width of a wavelength spectrum of the exposure light or a plurality of parameters of an exposure amount.

6. A device producing method comprising:
a step for exposing a wafer with a device pattern by an exposure apparatus according to claim 5; and
a step for developing the exposed wafer.

* * * * *

UNITED STATES PATENT AND TRADEMARK OFFICE
CERTIFICATE OF CORRECTION

| | | |
|---|---|---|
| PATENT NO. | : 7,123,346 B2 | |
| APPLICATION NO. | : 10/847318 | |
| DATED | : October 17, 2006 | |
| INVENTOR(S) | : Ryo Koizumi et al. | |

It is certified that error appears in the above-identified patent and that said Letters Patent is hereby corrected as shown below:

ON THE COVER PAGE:
   In item "(57) ABSTRACT," line 2, "an diaphragm" should read -- a diaphragm --.

COLUMN 5:
   Line 45, "an" should read -- a --.

COLUMN 8:
   Line 12, "a and the outside a" should read -- σ and the outside σ --.
   Lines 29-60 should be deleted.

COLUMN 9:
   Line 6, "calculation." should read

-- calculation:
      An example of calculating the CD bias between the repeated pattern and the isolated pattern in the mask 7 is illustrated in FIG. 10. The conditions of the optical system and the mask pattern information are first set in a step 1001. As indicated with respect to FIG. 3, the conditions may be set as a reticle pattern dense part nominal line width of 200 nm, a projection optical lens 8 NA of 0.65, an exposure wavelength of 248 nm and an inside annular illumination σ of 0.533. The pattern information of the mask 7 may be manually input or input from a bar code. The relation of the CD bias to the optical system conditions and the mask pattern information is obtained from previous measurements and may be stored in tables corresponding to the graphs of FIGS. 2, 3, 5, and 6 so that the CD bias is is calculated therefrom in step a step 1010. It is then determined in a step 1020 if the calculated CD bias is within a predetermined tolerance. If not, a diaphragm of the variable diaphragm 9, the turret-type diaphragm 13, and the relay lens system 3 is selected to change the CD bias in a step 1030 and the change is effected in a step 1040. A recalculation of the CD bias in a step 1030 and the change is effected in a step 1040. A recalculation of the CD bias is then performed using the changed conditions in the step 1010.

UNITED STATES PATENT AND TRADEMARK OFFICE
CERTIFICATE OF CORRECTION

| | |
|---|---|
| PATENT NO. | : 7,123,346 B2 |
| APPLICATION NO. | : 10/847318 |
| DATED | : October 17, 2006 |
| INVENTOR(S) | : Ryo Koizumi et al. |

It is certified that error appears in the above-identified patent and that said Letters Patent is hereby corrected as shown below:

<u>COLUMN 9</u>:
    Line 16, continued:

The loop from the step 1010 to the step 1040 is iterated until the CD bias is within the predetermined bias in the decision step 1020. As described with respect to FIG. 3, the turret-type diaphragm 13 or the relay lens system 3 may be controlled by the diaphragm controlling unit 11 so that the outside σ becomes 0.75 without changing the exposure amount from the condition of FIG. 2. Alternatively, as discussed with respect to FIG. 5, the variable diaphragm 9 may be controlled by the diaphragm controlling unit 11 so that the NA of the projection optical system 8, as in the graph of FIG. 5, is adjusted to provide the change in the CD bias. --

Signed and Sealed this

Twenty-fourth Day of April, 2007

JON W. DUDAS
*Director of the United States Patent and Trademark Office*